United States Patent
Ma et al.

(10) Patent No.: US 12,525,966 B2
(45) Date of Patent: Jan. 13, 2026

(54) DIGITAL PHASE INTERPOLATOR

(71) Applicant: MONTAGE ELECTRONICS (SHANGHAI) CO., LTD., Shanghai (CN)

(72) Inventors: Pingshun Ma, Shanghai (CN); Bo Qu, Shanghai (CN)

(73) Assignee: MONTAGE ELECTRONICS (SHANGHAI) CO., LTD., Shanghai (CN)

( * ) Notice: Subject to any disclaimer, the term of this patent is extended or adjusted under 35 U.S.C. 154(b) by 23 days.

(21) Appl. No.: 18/636,983

(22) Filed: Apr. 16, 2024

(65) Prior Publication Data
US 2024/0364319 A1    Oct. 31, 2024

(30) Foreign Application Priority Data
Apr. 25, 2023 (CN) .......................... 202310462262.9

(51) Int. Cl.
*H03K 5/13* (2014.01)
*H03K 3/037* (2006.01)
*H03K 5/00* (2006.01)

(52) U.S. Cl.
CPC .............. *H03K 5/13* (2013.01); *H03K 3/037* (2013.01); *H03K 2005/00052* (2013.01)

(58) Field of Classification Search
CPC . H03K 5/13; H03K 3/037; H03K 2005/00052
USPC ....................................................... 327/276
See application file for complete search history.

(56) References Cited

U.S. PATENT DOCUMENTS

| | | | | |
|---|---|---|---|---|
| 5,945,862 A * | 8/1999 | Donnelly | ............. | H03K 5/1565 327/279 |
| 6,650,159 B2 * | 11/2003 | Wang | .................. | G06F 11/2221 327/272 |
| 6,650,160 B2 * | 11/2003 | Tanahashi | .............. | H03K 5/131 327/284 |
| 7,482,884 B2 * | 1/2009 | Wang | ..................... | H03B 27/00 331/45 |
| 12,057,156 B2 * | 8/2024 | Yoon | ................... | G11C 11/4076 |
| 12,231,528 B2 * | 2/2025 | Moon | ....................... | G06F 1/04 |
| 2003/0006817 A1 * | 1/2003 | Seo | .......................... | H03K 5/13 327/276 |

(Continued)

FOREIGN PATENT DOCUMENTS

CN     110995212 A     4/2020

*Primary Examiner* — Ryan Jager
(74) *Attorney, Agent, or Firm* — Oliff PLC

(57) ABSTRACT

The application relates to the field of integrated circuit design and discloses a digital phase interpolator, comprising: a first delay unit, a pre-interpolating unit, a second delay unit, and a phase interpolating unit; wherein each interpolation branch comprises a pre-interpolating unit and a re-interpolating unit. For two input signals with preset phase differences, the digital phase interpolator performs two interpolation processes, one at the pre-interpolating unit and the other at the phase interpolating unit. This distributed quadratic interpolation reduces the task of the phase interpolation unit, helps to reduce the number of stages of the phase interpolating unit, reduces the input load, reduces the overall power consumption and the overall area, ensures the rationality of its own power consumption, and improves the linearity of phase interpolation to some extent.

10 Claims, 6 Drawing Sheets

(56) References Cited

U.S. PATENT DOCUMENTS

| | | | |
|---|---|---|---|
| 2006/0170459 A1* | 8/2006 | Shin | H03K 17/693 |
| | | | 326/113 |
| 2012/0286838 A1* | 11/2012 | Hsu | H03H 11/265 |
| | | | 327/231 |
| 2022/0343957 A1* | 10/2022 | Yoon | G11C 29/52 |
| 2024/0364319 A1* | 10/2024 | Ma | H03K 5/13 |
| 2025/0192764 A1* | 6/2025 | Ma | H03K 5/131 |

* cited by examiner

DIGITAL PHASE INTERPOLATOR

CROSS-REFERENCE TO PRIOR APPLICATION

This application claims priority to Chinese Application No. 202310462262.9 filed on Apr. 25, 2023, which is incorporated herein by reference in its entirety.

TECHNICAL FIELD

The disclosure generally relates to the technical field of integrated circuit design, in particular to a digital phase interpolator.

BACKGROUND

The phase adjustment of signals is usually achieved through phase interpolation (PI). Traditional phase interpolators can be equivalent to a cascaded structure of multiple inverters. In dealing with higher accuracy scenarios, the more bits of interpolation, the more inverters are needed. This will not only increase input load and overall power consumption, but also cause the overall area of the interpolator to be too large.

Therefore, there is an urgent need for a digital phase interpolator that can significantly reduce the input load, so as to reduce the overall power consumption and area, and improve the linearity of the phase interpolation.

SUMMARY OF THE INVENTION

An object of the present application is to provide a digital phase interpolator that pre-interpolates two input signals with a certain phase difference, and then performs quadratic interpolation, which not only reduce the overall power consumption and area, but also significantly reduces the input load, and improves the linearity of phase interpolation to a certain extent.

In order to realize the above-mentioned object, an embodiment of the present application discloses a digital phase interpolator, comprising:
  a first delay unit for receiving a first input signal and outputting a delayed first input signal to a phase interpolating unit;
  a pre-interpolating unit for receiving the first input signal and a second input signal, interpolating the first input signal and the second input signal, and outputting a first interpolation signal generated by the interpolating to the phase interpolating unit, wherein there is a preset phase difference between the first input signal and the second input signal;
  a second delay unit for receiving the second input signal and outputting a delayed second input signal to the phase interpolating unit;
  the phase interpolating unit for receiving the first interpolation signal, the delayed first input signal, and the delayed second input signal, and in response to a control signal selectively interpolating the first interpolation signal and the delayed first input signal to generate a second interpolation signal, or interpolating the first interpolation signal and the delayed second input signal to generate a third interpolation signal.

In another preferred embodiment, the first delay unit has the same structure as the second delay unit.

In another preferred embodiment, the first delay unit comprises: a first inverter, a second inverter, and a first buffer unit;
  an output end of the first inverter and an output end of the second inverter are both connected to an input end of the first buffer unit, an input end of the first inverter and an input end of the second inverter are both used to receive the first input signal, and an output end of the first buffer unit is connected to the phase interpolating unit.

In another preferred embodiment, the first buffer unit is composed of one inverter.

In another preferred embodiment, the pre-interpolating unit comprises: a first inverter group, a second inverter group, and a second buffer unit;
  the first inverter group comprises m inverters connected in parallel, the second inverter group comprises n inverters connected in parallel, and the m and n are integers greater than or equal to 1;
  an input end of the first inverter group and an input end of the second inverter group are respectively used to receive the first input signal and the second input signal, an output end of the first inverter group and an output end of the second inverter group are both connected to an input end of the second buffer unit, and an output end of the second buffer unit is connected to the phase interpolating unit.

In another preferred embodiment, the second buffer unit is composed of one inverter.

In another preferred embodiment, the phase interpolating unit comprises: a first phase interpolating unit, a second phase interpolating unit, a third phase interpolating unit, and a third inverter, wherein,
  the first phase interpolating unit is connected between an output end of the first delay unit and an input end of the third inverter, and the first phase interpolating unit comprises N basic interpolating units connected in parallel;
  the second phase interpolating unit is connected between an output end of the pre-interpolating unit and the input end of the third inverter, and the second phase interpolating unit comprises X basic interpolating units connected in parallel;
  the third phase interpolating unit is connected between an output end of the second delay unit and the input end of the third inverter, and the third phase interpolating unit comprises M basic interpolating units connected in parallel, wherein the N, X, and M are integers greater than or equal to 1;
  an output end of the third inverter is an output end of the phase interpolating unit;
  wherein the turn-on and turn-off of each basic interpolating unit are controlled by the control signal.

In another preferred embodiment, the X is the larger value of the M and the N.

In another preferred embodiment, the basic interpolating unit comprises: a fourth inverter and a switch;
  the turn-on and turn-off of the basic interpolating unit are controlled by controlling the switch via the control signal.

In another preferred embodiment, the fourth inverter comprises: a PMOS transistor and an NMOS transistor;
  a source of the PMOS transistor is connected to a high-level signal, and a source of the NMOS transistor is connected to a low-level signal;
  a gate of the PMOS transistor and a gate of the NMOS transistor are connected together as an input end of the basic interpolating unit;
  a drain of the PMOS transistor and a drain of the NMOS transistor are connected to the switch.

In another preferred embodiment, the switch in the basic interpolating unit comprises a first switch and a second switch, wherein the first switch is connected between the drain of the PMOS transistor and an output end of the basic interpolating unit, and the second switch is connected between the drain of the NMOS transistor and the output end of the basic interpolating unit.

A large number of technical features are described in the specification of the present application, and are distributed in various technical solutions. If a combination (i.e., a technical solution) of all possible technical features of the present application is listed, the description may be made too long. In order to avoid this problem, the various technical features disclosed in the above summary of the present application, the technical features disclosed in the various embodiments and examples below, and the various technical features disclosed in the drawings can be freely combined with each other to constitute various new technical solutions (all of which are considered to have been described in this specification), unless a combination of such technical features is not technically feasible. For example, feature A+B+C is disclosed in one example, and feature A+B+D+E is disclosed in another example, while features C and D are equivalent technical means that perform the same function, and technically only choose one, not to adopt at the same time. Feature E can be combined with feature C technically. Then, the A+B+C+D scheme should not be regarded as already described because of the technical infeasibility, and A+B+C+E scheme should be considered as already described.

DETAILED DESCRIPTION

In the following description, numerous technical details are set forth in order to provide the readers with a better understanding of the present application. However, those skilled in the art can understand that the technical solutions claimed in the present application can be implemented without these technical details and various changes and modifications based on the following embodiments.

In order to make the objects, technical solutions and advantages of the present application more clear, embodiments of the present application will be further described in detail below with reference to the accompanying drawings.

Figure 1:
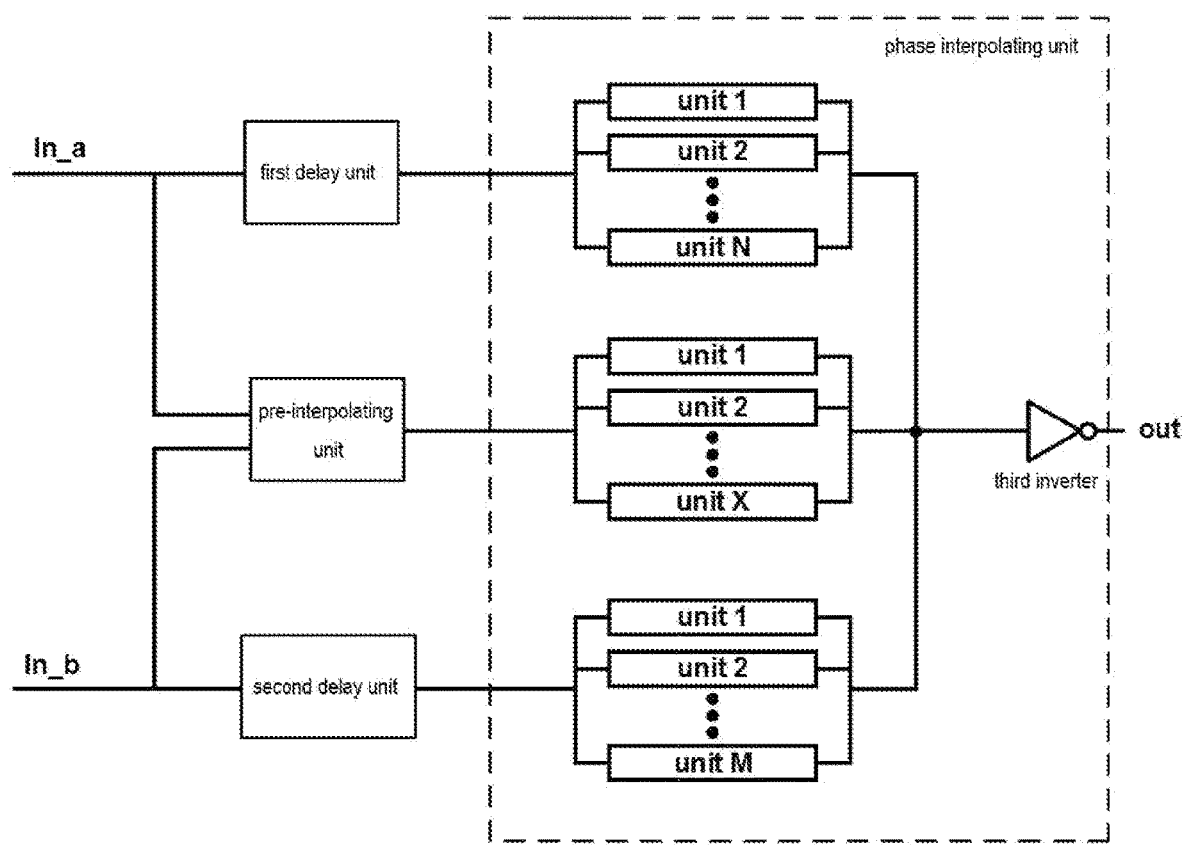
FIG. 1 is a circuit schematic diagram of a digital phase interpolator according to an embodiment of the present application.

An embodiment of the present application relates to a digital phase interpolator. FIG. 1 is a circuit schematic diagram of the digital phase interpolator.

Specifically, as shown in FIG. 1, the digital phase interpolator comprises:

a first delay unit for receiving a first input signal and outputting a delayed first input signal to a phase interpolating unit;

a pre-interpolating unit for receiving the first input signal and a second input signal, interpolating the first input signal and the second input signal, and outputting a first interpolation signal generated by the interpolating to the phase interpolating unit, wherein a preset phase difference is between the first input signal and the second input signal;

a second delay unit for receiving the second input signal and outputting a delayed second input signal to the phase interpolating unit;

the phase interpolating unit for receiving the first interpolation signal, the delayed first input signal, and the delayed second input signal, and in response to a control signal, selectively interpolating the first interpolation signal and the delayed first input signal to generate a second interpolation signal, or interpolating the first interpolation signal and the delayed second input signal to generate a third interpolation signal.

As shown in FIG. 1, from the overall structure, the digital phase interpolator in this embodiment performs two interpolation processes, one at the pre-interpolating unit and the other at the phase interpolating unit.

Figure 2:
FIG. 2 is a schematic diagram of phase relationships of signals a, b, and k according to an embodiment of the present application.
Figure 3:
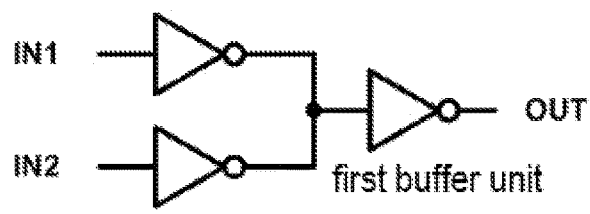
FIG. 3 is a circuit schematic diagram of a pre-interpolating unit or a delay unit according to an embodiment of the present application.
Figure 4:
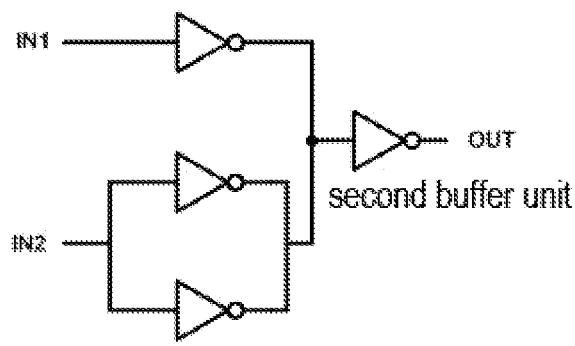
FIG. 4 is a circuit schematic diagram of a pre-interpolating unit according to an embodiment of the present application.

In particular, for the first input signal In_a and the second input signal In_b, the pre-interpolating unit is used to perform the first interpolation on the input signals In_a and In_b, wherein the input signals In_a and In_b are a pair of signals with the same frequency and a certain phase difference. The pre-interpolating unit interpolates the input signals In_a and In_b to generate and output the first interpolation signal. A phase k of the first interpolation signal is between the phase a of the input signal In_a and the phase b of the input signal In_b. Assuming the phase relationship of input signals In_a and In_b is shown in FIG. 2, where the phase k of the first interpolation signal may be at the position of exact middle c between the phase a and the phase b, or may be biased towards phase a or phase b, depending on the structure of the pre-interpolating unit. For example, if the structure of the pre-interpolating unit is shown in FIG. 3, then the phase k of the first interpolation signal is located at the position of exact middle of phase a and phase b, that is, the position of phase c. If the structure of the pre-interpolating unit is shown in FIG. 4, then the phase k of the first interpolation signal may be located at the position d.

The phase interpolating unit receives the first interpolation signal output by the pre-interpolating unit, as well as the delayed input signals In_a and In_b output by the first delay unit and the second delay unit. The phase interpolating unit also selectively interpolates the delayed input signal In_a and the first interpolation signal to generate the second interpolation signal, or interpolates the delayed input signal In_b and the first interpolation signal to generate the third interpolation signal in response to the control signal. A phase of the final generated interpolation signal must be between the phase a of the delayed input signal In_a and the phase k of the first interpolation signal (such as the second interpolation signal), or between the phase b of the delayed input signal In_b and the phase k of the first interpolation signal (such as the third interpolation signal).

In summary, it can be seen that in the digital phase interpolator, the first interpolation of the pre-interpolating unit generates the first interpolation signal with a phase between the phase of the input signal In_a and the phase of the input signal In_b, while the second interpolation of the phase interpolating unit is to perform a smaller range of interpolation between the delayed input signal In_a and the first interpolation signal, or between the delayed input signal In_b and the first interpolation signal, that is, multi-interpolation (MI). The setting of pre-interpolating unit reduces the task of phase interpolating unit, which is beneficial for reducing the number of stages of the phase interpolating unit, reducing the input load, the overall power consumption and the overall area, and improving the linearity of the phase interpolation to some extent.

In some embodiments, the structure of the first delay unit is the same as that of the second delay unit to ensure that the phase difference between the delayed input signals In_a and In_b remains unchanged.

Specifically, in the digital phase interpolator shown in FIG. 1, the first delay unit and the second delay unit have the same structure which respectively delay the input signals In_a and In_b, so that the phase difference between the delayed input signals In_a and In_b remains the same as the phase difference between the initial input signals In_a and In_b. The setting of the first delay unit and the second delay unit also provides sufficient driving force for the load(s) of the subsequent phase interpolating unit(s). In addition, from the above description, it can also be seen that the signals output by the first delay unit and the second delay unit ensure the upper and lower limits for the interpolation by the phase interpolating unit, that is, the phase of the final output signal must be within the phase range between the input signals In_a and In_b.

In some embodiments, both the first delay unit and the second delay unit may include two small-sized inverters and one buffer, wherein the buffer is used to drive the subsequent loads. As shown in FIG. 3, both the first delay unit and the second delay unit include a first inverter, a second inverter, and a first buffer unit.

An output end of the first inverter and an output end of the second inverter are both connected to an input end of the first buffer unit; an input end IN1 of the first inverter and an input end IN2 of the second inverter are both used to receive the first input signal or the second input signal, and an output end of the first buffer unit is connected to the phase interpolating unit.

In some embodiments, the first buffer unit is composed of one inverter. It should be noted that in the various embodiments of the application, each buffer unit may be composed of an inverter or a NAND gate. The buffer unit may be any suitable device that can provide driving capability, and its specific structural is not limited here.

Figure 5:
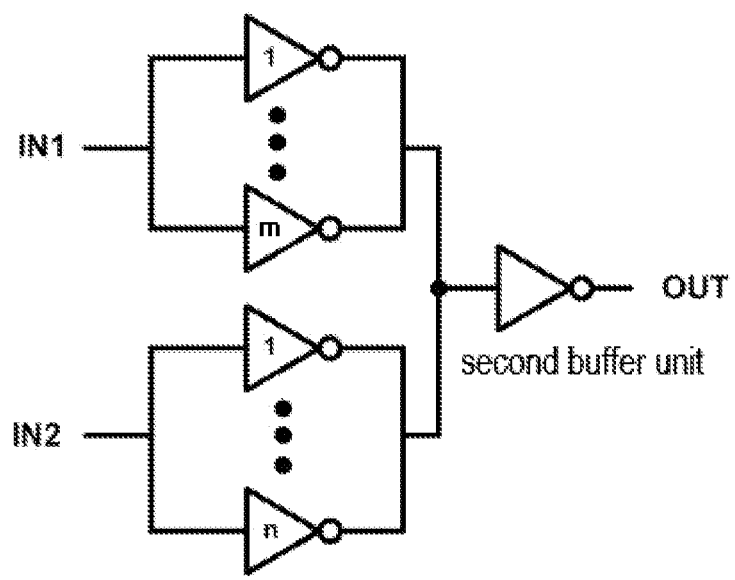
FIG. 5 is a circuit schematic diagram of a pre-interpolating unit according to another embodiment of the present application.

In some embodiments, as shown in FIG. 5, the pre-interpolating unit includes a first inverter group, a second inverter group, and a second buffer unit;

the first inverter group includes m inverters connected in parallel, the second inverter group includes n inverters connected in parallel, and the m and n are both integers greater than or equal to 1;

an input end IN1 of the first inverter group and an input end IN2 of the second inverter group are respectively used to receive the first input signal and the second input signal, an output end of the first inverter group and an output end of the second inverter group are both connected to an input end of the second buffer unit (buffer), and an output end OUT of the second buffer unit is connected to the phase interpolating unit.

In some embodiments, the second buffer unit may also be composed of one inverter.

As mentioned above, in the digital phase interpolator, the pre-interpolating unit can perform multi pre-interpolation for the input signals, that is, after the pre-interpolation by the pre-interpolating unit, a part of the phase interval is n/(m+n), and the other part of the phase interval is m/(m+n).

In some embodiments, as shown in FIG. 1, the phase interpolating unit includes a first phase interpolating unit, a second phase interpolating unit, a third phase interpolating unit, and a third inverter, wherein, the first phase interpolating unit is connected between an output end of the first delay unit and an input end of the third inverter, and the first phase interpolating unit includes N basic interpolating units (refers to unit1, unit2, . . . , unitN in FIG. 1) connected in parallel;

the second phase interpolating unit is connected between an output end of the pre-interpolating unit and the input end of the third inverter, and the second phase interpolating unit includes X basic interpolating units (refers to unit1, unit2, . . . , unitX in FIG. 1) connected in parallel;

the third phase interpolating unit is connected between an output end of the second delay unit and the input end of the third inverter, and the third phase interpolating unit includes M basic interpolating units (refers to unit1, unit2, . . . , unitM in FIG. 1) connected in parallel, wherein the N, X, and M are all integers greater than or equal to 1;

an output end of the third inverter is an output end of the phase interpolating unit;

wherein the turn-on and turn-off of each basic interpolating unit are controlled by the control signal.

In some embodiments, in the case of interpolating at equal intervals, the X is the larger value of the M and the N.

As shown in FIG. 1, the M in the third phase interpolating unit is required to follow a formula: M=m/(m+n)*N, and the X is the larger value of M and N in the case of interpolating at equal intervals. If interpolation is not required at equal intervals, the values of M and N can be any integer greater than or equal to 1.

In some embodiments, the basic interpolating unit includes a fourth inverter and a switch.

The control signal controls the turn-on and turn-off of the basic interpolating unit by controlling the switch.

As shown in FIG. 1, each basic interpolating unit consists of one inverter and one switch. When the phase interpolating unit needs to output the second interpolation signal, all switches in the M basic interpolating units in the third phase interpolating unit must be turned off. Similarly, if the phase interpolating unit needs to output the third interpolation signal, all switches in the N basic interpolating units in the first phase interpolating unit must be turned off.

Taking the output of the second interpolation signal as an example, at this time, all the switches in the M basic interpolating units in the third phase interpolating unit are turned off. The phase of the final output second interpolation signal is also affected by the number of the switches that is turned on in the N basic interpolating units in the first phase interpolating unit and the number of the switches that is turned on in the X basic interpolating units in the second phase interpolating unit. That is to say, by controlling the turn-on and turn-off of the switches in each basic interpolating unit, an interpolation signal with desired phase can be output.

Figure 6:
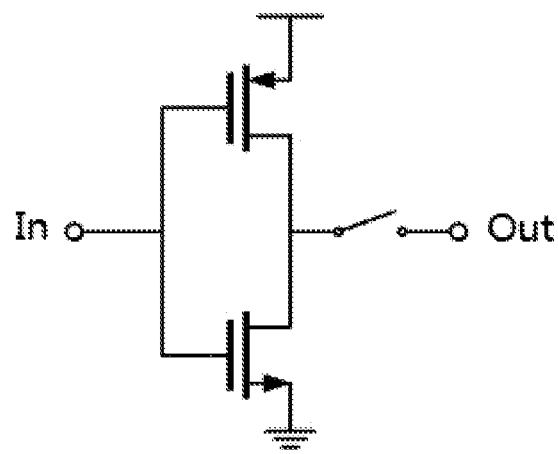
FIG. 6 is a circuit schematic diagram of a basic interpolating unit according to an embodiment of the present application.

In some embodiments, the structure of the basic interpolating unit is shown in FIG. 6, wherein the fourth inverter includes a PMOS transistor and an NMOS transistor.

A source of the PMOS transistor is connected to a high-level signal, and a source of the NMOS transistor is connected to a low-level signal.

A gate of the PMOS transistor and a gate of the NMOS transistor are connected together as an input end In (refers to the end In in FIG. 6) of the basic interpolating unit.

A drain of the PMOS transistor and a drain of the NMOS transistor are connected to the switch.

It should be noted that in the various embodiments of this application, the basic structure of each inverter mentioned is composed of a PMOS and an NMOS. Therefore, if the size of the PMOS or the NMOS is changed, it is equivalent to the change of inverter.

Figure 7:
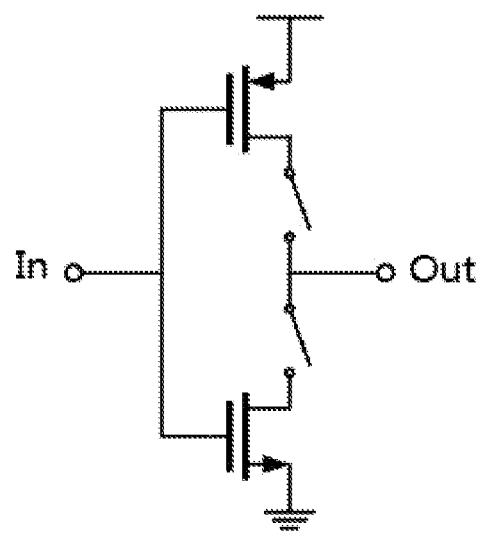
FIG. 7 is a circuit schematic diagram of a basic interpolating unit according to another embodiment of the present application.

In some embodiments, the structure of the basic interpolating unit is shown in FIG. 7. Compared with FIG. 6, the switch in the basic interpolating unit in FIG. 7 includes a first switch and a second switch. The first switch is connected between the drain of the PMOS transistor and an output end Out (refers to the end Out in FIG. 7) of the basic interpolating unit, and the second switch is connected between the drain of the NMOS transistor and the output end Out (refers to the end Out in FIG. 7) of the basic interpolating unit.

In some embodiments, the switch in the basic interpolating unit can be controlled by encoding to control the turn-off of the basic interpolating unit that is not working.

In some embodiments, the phase interpolating unit may be implemented by using a traditional digital phase interpolator.

Figure 8:
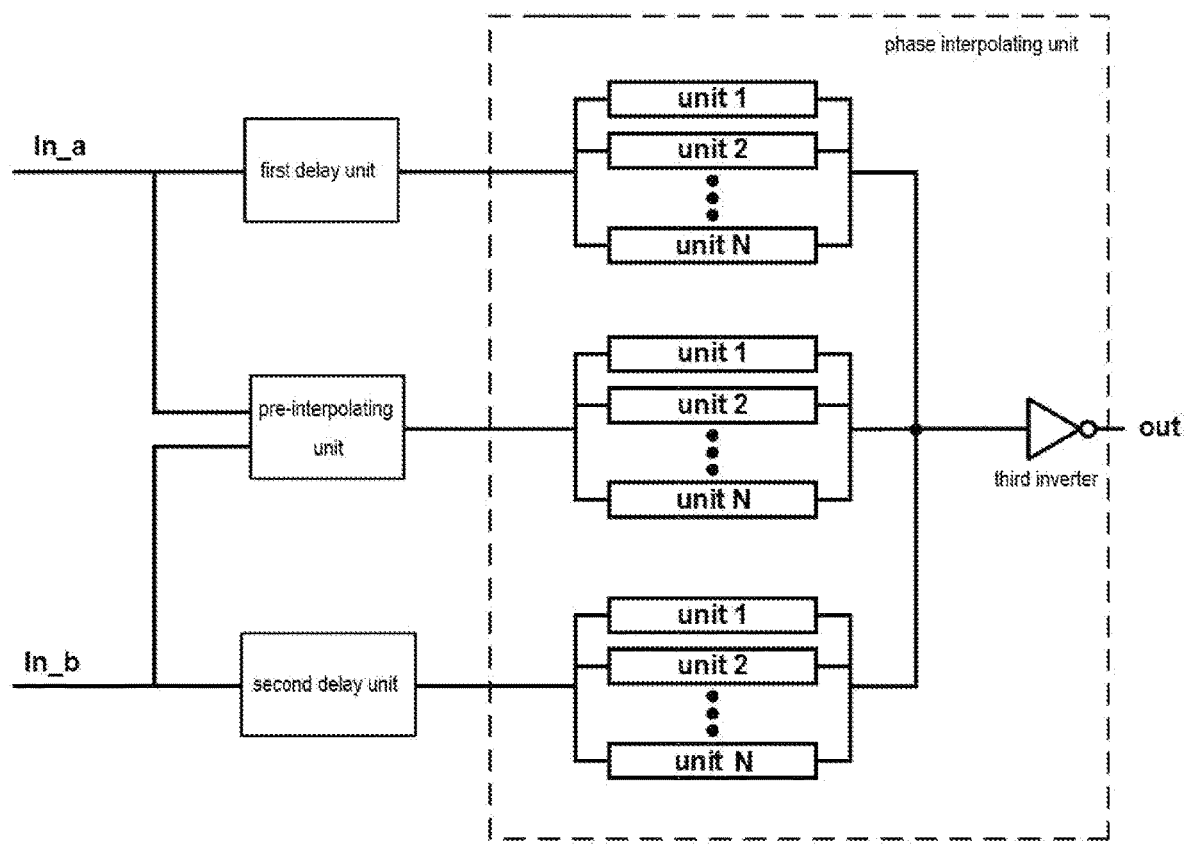
FIG. 8 is a circuit schematic diagram of a digital phase interpolator according to an embodiment of the present application.

For example, when using the digital phase interpolator provided in this application to achieve 2×N bit interpolation, if m=1 and n=1, the pre-interpolating unit performs ½ pre-interpolation for the input signals. In this case, the circuit schematic diagram of the digital phase interpolator is shown in FIG. 8, wherein the structures of the pre-interpolating unit, the first delay unit, and the second delay unit are the same, as shown in FIG. 3. The structure of the first phase interpolating unit, the second phase interpolating unit, and the third phase interpolating unit are all the same, each comprising N basic interpolating units connected in parallel.

For example, for the digital phase interpolator to achieve 2×N bit interpolation, when m=1 and n=2, the pre-interpolating unit performs multi bit pre-interpolation for the input signals. The circuit schematic diagram of the pre-interpolating unit is shown in FIG. 4.

Figure 9:
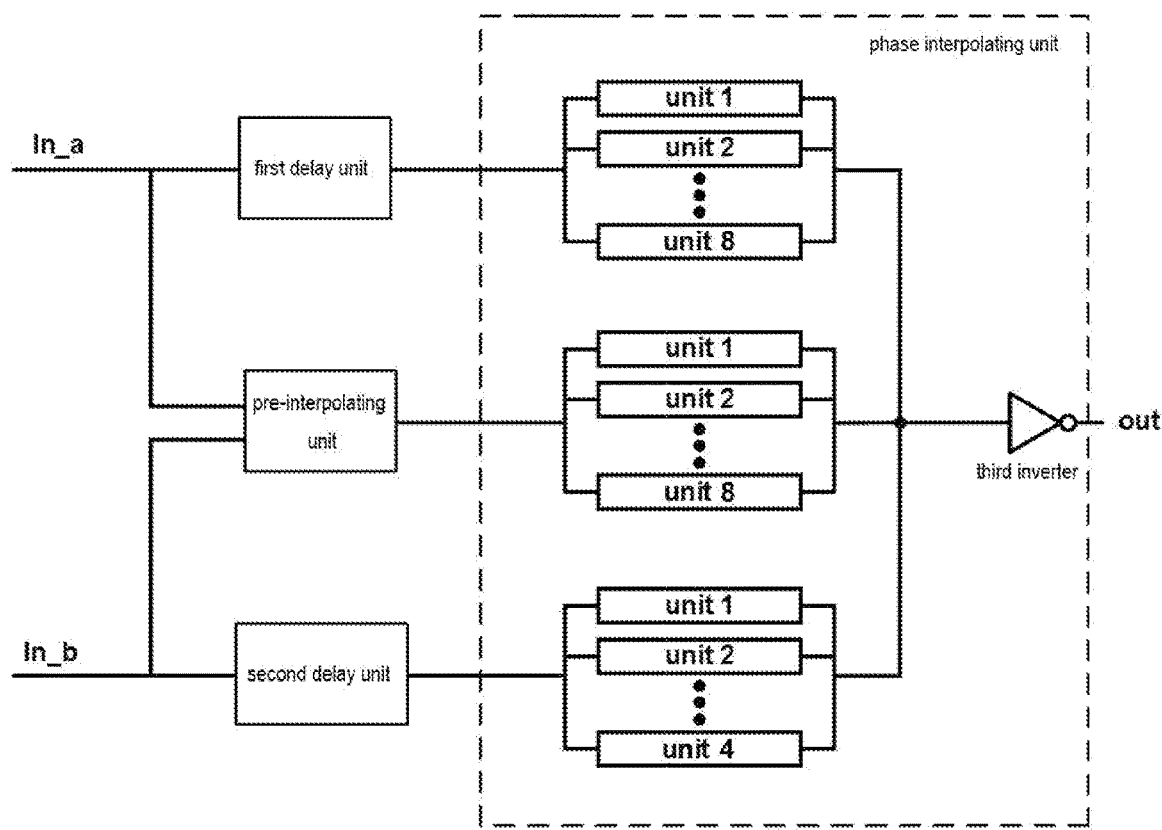
FIG. 9 is a circuit schematic diagram of a digital phase interpolator according to another embodiment of the present application.

When m=1 and n=1, assuming N=8, then M=4 can be calculated according to the formula M=m/(m+n)*N. Since N is greater than M, X is 8. In this case, the circuit schematic diagram of the digital phase interpolator is shown in FIG. 9.

Compared to the traditional digital phase interpolators, the digital phase interpolator described in this application is used for the fine delay of the delay circuit which makes the overall power consumption and area of the delay circuit are greatly reduced due to the reduced input load.

Figure 10:
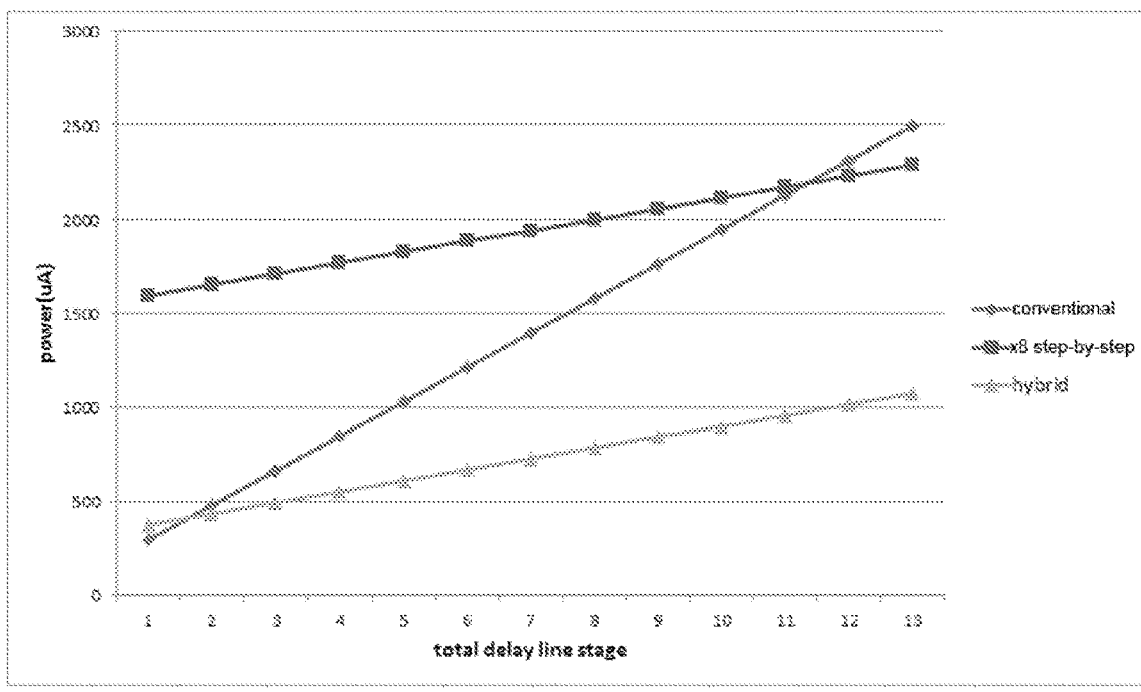
FIG. 10 shows a schematic diagram of comparisons of the overall power consumption of the whole delay circuit.

FIG. 10 shows a schematic diagram of comparisons of the overall power consumption of the whole delay circuit. It can be seen that as the number of the overall stages of the phase interpolating units increases, compared to the digital phase interpolators using traditional direct interpolation methods and the digital phase interpolators using traditional eight bit step-by-step interpolation methods in the prior art, the power consumption of the digital phase interpolator described in this application will be significantly lower than that of other structures.

Figure 11:
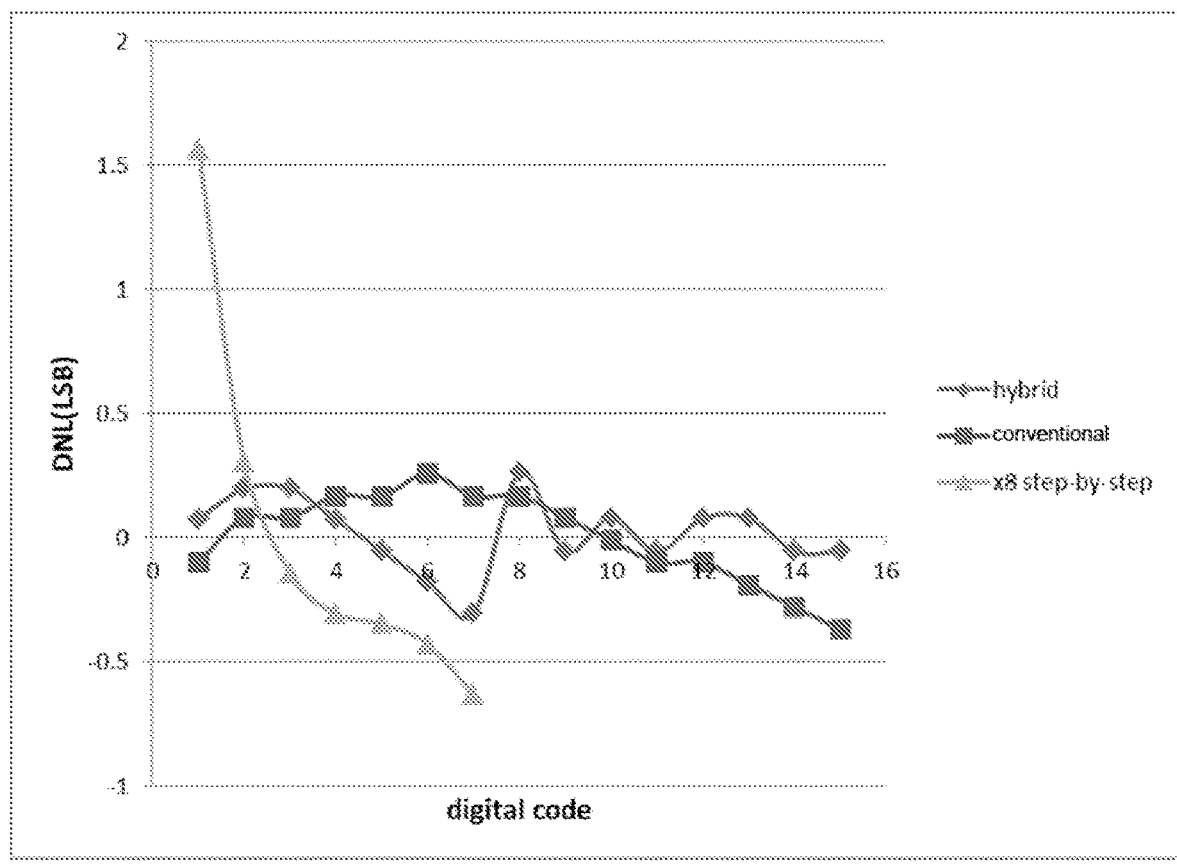
FIG. 11 shows a schematic diagram of linearity comparisons of the phase interpolators.

FIG. 11 shows a schematic diagram of differential non-linearity (DNL) comparisons of the phase interpolators themselves. It can be seen that compared to the digital phase interpolators using traditional direct interpolation methods and the digital phase interpolators using traditional eight bit step-by-step interpolation methods in the prior art, the linearity of the digital phase interpolator described in this application has also been improved to a certain extent.

In summary, in the digital phase interpolator of the present application, the first interpolation performed by the pre-interpolating unit generates the first interpolation signal with a phase between two input signals, then the phase interpolating unit can perform a smaller range of interpolation between the two input signals and the first interpolation signal respectively, i.e. multi interpolation. This distributed quadratic interpolation reduces the task of the phase interpolating unit, reduces the number of the stages of the phase interpolating units, reduces the load and overall circuit area, ensures the rationality of its own power consumption, and improves the linearity of phase interpolation to some extent.

That is to say, the digital phase interpolator of this application firstly pre-interpolates two input signals with a certain phase difference, and then performs quadratic interpolation so that it significantly reduces the input load and ensures the rationality of its own power consumption simultaneously, and improves the linearity of phase interpolation to a certain extent.

It should be noted that the circuit components disclosed in the embodiments of the present application are all logic modules, physically, a logic module can be a physical module, a part of a physical module, or a combination of multiple physical modules. The physical implementing methods of these logic modules themselves are not the most important. The combination of functions achieved by these logic modules is the key to solve the technical problem disclosed in the present application. In addition, in order to highlight the innovative part of the present application, the above circuit or device embodiments of the present application do not introduce the modules which are not related closely to solve the technical problem disclosed in the present application, which does not indicate that the above circuit or device embodiments do not include other modules.

It should be noted that in the claims and description of the present application, relationship terms such as first, second etc. are just used to distinguish one entity or operation from another entity or operation, and do not necessarily require or indicate any practical relation or sequence existing between these entities or operations. Moreover, the terms "include", "comprise" or any other variation thereof are intended to encompass non-exclusive inclusion, such that a process, method, item or device that comprises a series of elements not only includes those elements, but also includes other elements that are not explicitly listed, or also includes elements inherent to such process, method, item or device. Without further limitations, the element defined by the phrase "include one" does not exclude another identical element existing in the process, method, item or device that includes the element.

By referring to some preferred embodiments of the application, the application has been illustrated and described. But it should be understood to those skilled in the art that various changes can be made in form and details without departing from the spirit and scope of the present application.

What is claimed is:

1. A digital phase interpolator, comprising:
    a first delay unit for receiving a first input signal and outputting a delayed first input signal to a phase interpolating unit;
    a pre-interpolating unit for receiving the first input signal and a second input signal, interpolating the first input signal and the second input signal, and outputting a first interpolation signal generated by the interpolating to the phase interpolating unit, wherein there is a preset phase difference between the first input signal and the second input signal;
    a second delay unit for receiving the second input signal and outputting a delayed second input signal to the phase interpolating unit;
    the phase interpolating unit for receiving the first interpolation signal, the delayed first input signal, and the delayed second input signal, and in response to a control signal selectively interpolating the first interpolation signal and the delayed first input signal to generate a second interpolation signal, or interpolating the first interpolation signal and the delayed second input signal to generate a third interpolation signal,
    wherein:
    the phase interpolating unit comprises: a first phase interpolating unit, a second phase interpolating unit, a third phase interpolating unit, and a third inverter;
    the first phase interpolating unit is connected between an output end of the first delay unit and an input end of the third inverter, and the first phase interpolating unit comprises N basic interpolating units connected in parallel;
    the second phase interpolating unit is connected between an output end of the pre-interpolating unit and the input end of the third inverter, and the second phase interpolating unit comprises X basic interpolating units connected in parallel;
    the third phase interpolating unit is connected between an output end of the second delay unit and the input end of the third inverter, and the third phase interpolating unit comprises M basic interpolating units connected in parallel, wherein the N, X, and M are integers greater than or equal to 1;
    an output end of the third inverter is an output end of the phase interpolating unit; and
    the turn-on and turn-off of each basic interpolating unit are controlled by the control signal.

2. The digital phase interpolator according to claim 1, wherein the first delay unit has the same structure as the second delay unit.

3. The digital phase interpolator according to claim 2, wherein the first delay unit comprises: a first inverter, a second inverter, and a first buffer unit;
    an output end of the first inverter and an output end of the second inverter are both connected to an input end of the first buffer unit, an input end of the first inverter and an input end of the second inverter are both used to receive the first input signal, and an output end of the first buffer unit is connected to the phase interpolating unit.

4. The digital phase interpolator according to claim 3, wherein the first buffer unit is composed of one inverter.

5. The digital phase interpolator according to claim 1, wherein the pre-interpolating unit comprises: a first inverter group, a second inverter group, and a second buffer unit;
    the first inverter group comprises m inverters connected in parallel, the second inverter group comprises n inverters connected in parallel, and the m and n are integers greater than or equal to 1;
    an input end of the first inverter group and an input end of the second inverter group are respectively used to receive the first input signal and the second input signal, an output end of the first inverter group and an output end of the second inverter group are both connected to an input end of the second buffer unit, and an output end of the second buffer unit is connected to the phase interpolating unit.

6. The digital phase interpolator according to claim 5, wherein the second buffer unit is composed of one inverter.

7. The digital phase interpolator according to claim 1, wherein the X is the larger value of the M and the N.

8. The digital phase interpolator according to claim 1, wherein the basic interpolating unit comprises: a fourth inverter and a switch;
    the turn-on and turn-off of the basic interpolating unit are controlled by controlling the switch via the control signal.

9. The digital phase interpolator according to claim 8, wherein the fourth inverter comprises: a PMOS transistor and an NMOS transistor;
    a source of the PMOS transistor is connected to a high-level signal, and a source of the NMOS transistor is connected to a low-level signal;
    a gate of the PMOS transistor and a gate of the NMOS transistor are connected together as an input end of the basic interpolating unit;
    a drain of the PMOS transistor and a drain of the NMOS transistor are connected to the switch.

10. The digital phase interpolator according to claim 9, wherein the switch in the basic interpolating unit comprises a first switch and a second switch, wherein the first switch is connected between the drain of the PMOS transistor and an output end of the basic interpolating unit, and the second switch is connected between the drain of the NMOS transistor and the output end of the basic interpolating unit.

* * * * *